(12) United States Patent
Pautrat et al.

(10) Patent No.: US 6,570,187 B1
(45) Date of Patent: May 27, 2003

(54) SILICON LIGHT-EMITTING DEVICE AND METHOD FOR THE PRODUCTION THEREOF

(75) Inventors: Jean-Louis Pautrat, Grenoble (FR); Hélène Ulmer, Venon (FR); Noël Magnea, Moivuus (FR); Emmanuel Hadji, Fonzaine (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/913,168

(22) PCT Filed: Feb. 7, 2000

(86) PCT No.: PCT/FR00/00279

§ 371 (c)(1),
(2), (4) Date: Aug. 9, 2001

(87) PCT Pub. No.: WO00/48275

PCT Pub. Date: Aug. 17, 2000

(30) Foreign Application Priority Data

Feb. 10, 1999 (FR) ............................................. 99 01560

(51) Int. Cl.⁷ ............................................. H01L 33/00
(52) U.S. Cl. ............................. 257/79; 257/10; 257/11; 257/13; 257/14; 257/19; 257/21; 257/22; 257/80; 257/81; 257/82; 257/83; 257/184; 257/185; 257/186
(58) Field of Search ................................. 257/9, 10, 11, 257/13, 14, 19, 21, 22, 67, 72, 79, 80, 81, 82, 83, 84, 85, 183, 184, 185, 186, 225, 227, 228, 290, 291, 292, 293, 420, 431, 432, 439

(56) References Cited

U.S. PATENT DOCUMENTS

| 5,107,538 A | 4/1992 | Benton et al. |
|---|---|---|
| 5,374,564 A | 12/1994 | Bruel |
| 5,563,979 A | 10/1996 | Bruce et al. |
| 5,917,195 A * | 6/1999 | Brown ..................... 257/17 |

FOREIGN PATENT DOCUMENTS

| EP | 0 517 440 A2 | 12/1992 |
| EP | 0 578 407 A1 | 7/1997 |
| GB | 2 275 820 A | 2/1993 |
| WO | 96/25767 | 8/1996 |

OTHER PUBLICATIONS

Ennen H et al "1.54– mu m Electroluminescence of erbium–doped silicon grown by molecular beam epitaxy" Applied Physics Letters, Feb. 15, 1985, USA, vol. 46, No. 4, pp. 381–383, XP002137329, ISSN: 0003–6951 the whole document.

Rittinger A. et al: "Influence of the Erbium and Oxygen Content on the Electroluminescence of Epitaxially Grown Erbium–Doped Silicon Diodes" Applied Physics Letters, vol. 70, No. 18, May 5, 1997, pp. 2431–2433, XP000701346, ISSN: 0003–6951 abstract.

(List continued on next page.)

*Primary Examiner*—Nathan J. Flynn
*Assistant Examiner*—Pershelle Greene
(74) *Attorney, Agent, or Firm*—Pearne & Gordon LLP

(57) ABSTRACT

The invention concerns a light emitting and guiding device comprising at least one active region (22) in silicon and the means for creating photons in the said active region. In accordance with the invention, the means for creating the photons comprise a diode (22c, 22d) formed in the active region. In addition, the device includes the means for confining the carriers injected by the diode, and the silicon in the active region is mono-crystalline.

19 Claims, 5 Drawing Sheets

OTHER PUBLICATIONS

Schubert, A. et al: "Giant Enhancement of Luminescence Intensity in Er–doped $Si/SiO_2$ Resonant Cavities" Applied Physics Letters 61 (12) Sep. 1992, cited specs. p. 3

Soref, R. "Silicon Intersubband Lasers" Superlattices and Microstructures, vol. 23, No. 2, 1998, cited specs. p. 3.

Fukatsu S. et al: "Cavity Mode Luminescence of Strained SI1–XGEX/SI Quantum Wells Grown on a Buried–Oxide Substrate" Journal of Crystal Growth, vol. 150, No. 1/04, part 02, May 1, 1995, pp. 1055–1059, XP000627835, ISSN: 0022–0248, abstract.

Soref, R. Prospects for Novel Si–based Optoelectronic Devices: Unipolar and p–i–p–i Lasers, Thin solid films, 294 (1997), 325–329, cited specs. p. 3.

Tajima, M. et al. "Luminescence Due to Electron–hole Condensation in Silicon–on–insulator" Journal of Applied Physics, vol. 84, No. 4, Aug. 15, 1998, cited specs. p. 3.

Tajima, M. et al "Characterization of Bond and Etch–back Silicon–on–insulator Wafers By Photoluminescence Under Ultraviolet Excitation" Applied Physics Letters, 70 (2), Jan. 13, 1997, cited specs. p. 3.

* cited by examiner

SILICON LIGHT-EMITTING DEVICE AND METHOD FOR THE PRODUCTION THEREOF

TECHNICAL DOMAIN

The present invention concerns a light emitting and guiding device with an active region based on silicon, and processes for manufacturing such a device.

An active region is taken to mean a region of the device in which the light is generated and/or guided before leaving the device.

The invention finds applications in the manufacture of optical or optoelectronic components such as electroluminescent diodes, lasers, or possibly photodetectors.

A particularly advantageous application of the invention, linked to the use of silicon for the active region, is the manufacture of integrated circuits that combine both electronic components and optical components. Electronic components are in fact mainly manufactured from silicon, due to the intrinsic qualities of this semi-conductive material, and due to the widespread development of technologies relating to its applications.

PRIOR TECHNICAL SITUATION

As evoked above, silicon is very widely employed in the manufacture of electronic components or integrated circuits using semi-conductors.

However, in certain applications, in which components intended for light emission are used, silicon turns out to be unsuitable.

In fact, silicon is a semi-conductor with an indirect forbidden band and is not suitable for the rapid recombination of carriers, in other words, electron-hole pairs, with the production of light. When the elgctrons and the holes are brought together, for example when directly polarising a p-n junction formed in the silicon, their average recombination time can reach periods of several microseconds or even longer. In fact, the phenomenon of carrier recombination is dominated by other processes that are more rapid than the radiative recombination. These processes essentially correspond to the non-radiative recombination of the carriers on defects and impurities.

The defects and impurities play an important role, even if their concentration is low. The carriers move in the semi-conductor over a large distance and the probability of their encountering a defect or impurity is high.

Thus, in a certain number of applications, silicon must be replaced by another semi-conductive material with a direct forbidden band such as, for example, gallium arsenide (GaAs). As an indication, for this semi-conductor, the average recombination time of the electron-hole pairs is around one nanosecond.

Gallium arsenide is however an expensive material and more complex to implement.

In a certain number of specific cases, and in specific conditions of use, silicon has been proposed for making light emitting or conducting devices. Examples of such uses of silicon are proposed, in particular, in documents (1) to (7), whose references are detailed at the end of the present description.

The documents propose techniques that make it possible to increase the efficiency of light emission by silicon. Nevertheless, these techniques are not generally suited to the requirements of the integration of components.

In a more specific manner, documents (6) and (7) describe light emitting or conducting devices. Examples of such uses of silicon are proposed, in particular, in documents (1) to (9), whose references are detailed at the end of the present description.

The documents propose techniques that make it possible to increase the efficiency of light emission by silicon. Nevertheless, these techniques are not generally suited to the requirements of the integration of components.

In a more specific manner, documents (6) and (7) describe light emitting devices made on a silicon type substrate over an insulator (SOI—Silicon an Insulator), increasingly used in the micro-electronics field. However, the low temperature operating conditions and the isotropic character of the light emission of the devices also constitute obstacles to their use as components in circuits.

Documents (8) and (9) describe, respectively, a photon resonator and particular embodiments of silicon diodes doped with erbium.

DESCRIPTION OF THE INVENTION

The aim of the present invention is to propose a device capable of emitting but also guiding light, which is based on silicon and which can be manufactured according to common techniques specific to the micro-electronics field.

Another aim is to propose such a device that can be used as an individual component or as an integrated component in a circuit, in association with other optical or electronic components.

Another aim is to propose such a device with an improved light emission output and capable of operating at ambient temperature.

Another aim is to propose manufacturing processes for a device according to the invention.

In order to achieve these aims, the objective of the invention is more precisely an emitting and guiding device as defined in claim 1. Claims 2 to 16 indicate particular embodiments of the device.

The device described in the invention has the advantage of both confining the carriers within a restricted region, the active region, in such a way as to reduce the probability of the carriers encountering non-radiative centres, and the advantage of offering the carriers, in this region, radiative centres with a short life time.

A short life time is taken to mean a life time shorter than the life time linked to the probability of non-radiative recombination on defects or impurities in the active region.

The active region is, for example, a thin, continuous film of silicon stacked between the first and second insulator layers. This film is preferably mono-crystalline, which gives it better radiative qualities.

According to a particular embodiment of the device described in the invention, the means used to confine the carriers comprise the first and second insulator layers and the whole assembly, comprising the active region and the insulator layers, has an optical thickness e, whereby:

$$e = k\frac{\lambda}{2}$$

and where k is a natural integer.

In this particular embodiment, adapted to a device operating at a given wavelength $\lambda$, the light is confined in the active region. It propagates in the principal plane of this region, particularly in the case where the active region is a thin layer of silicon, by total reflection on the insulator layers. The principal plane is defined as a plane of the active region more or less parallel to that of the insulator layers.

The total reflection is obtained thanks to an appropriate step index between the material in the active region (Si) and the material used for the insulator layers (for example $SiO_2$).

The optical thickness e of the layer or the active region in silicon is adapted to the working wavelength $\lambda$ in such a way that: $e=k\lambda/2$, where k is an integral number.

According to a variant of the invention, the propagation can also be allowed to be perpendicular to the principal plane. In this case, the device can, moreover, comprise the means of reflecting the light comprising at least one mirror arranged on a free face of at least one of the first and second insulator layers.

More precisely, the means of reflecting the light can comprise a first mirror arranged on the free face of the first insulator layer and a second mirror arranged on the free face of the second insulator layer, with the first and second mirrors having different transmission coefficients.

The mirror with the highest transmission coefficient can then be used as a light exit mirror.

Moreover, the first and second mirrors can form a Fabry-pérot type cavity with the active region.

It should be pointed out that the means of reflection also have a function of guiding the light.

As indicated previously, the active region contains radiative centres, in other words, centres that allow the radiative recombination of the carriers.

Different types of radiative centres can be used and may possibly be combined in the active region.

A first type of radiative centre can be formed from the ions of rare earth elements, possibly accompanied by other impurities.

The rare earth elements, such as, for example, erbium, praseodymium or neodymium are efficient radiative recombination centres. The wavelength of the emitted light is mainly determined by the nature of the rare earth element and only to a very small extent by the matrix, in other words, silicon in this case. The rare earth elements mentioned above are particularly interesting because their emission corresponds to wavelengths that are useful for fibre optic telecommunications (1.3 and 1.54 microns). Co-doping with other impurities such as oxygen, carbon, nitrogen or fluorine can even increase this emission in a significant manner.

A second type of radiative centre can be formed by a quantum well or a succession of several quantum wells formed by thin layers of germanium or a $Si_{1-x}Ge_x$ alloy (where $0<X\leq1$) or SiGeC or any other compound suitable for the formation of quantum wells. The thickness of the layers forming the wells can, for example, be around 5 nm. In addition, the total thickness of these layers is preferably kept below a critical thickness corresponding to the appearance of lattice mismatch dislocations in the silicon. In this way, the crystalline quality in the active region remains very good. The quantum wells lead to increased radiative recombination efficiency. Moreover, a succession of wells and very thin barriers can lead to the formation of a band structure similar to a direct forbidden band structure, with a high probability of radiative recombination. Barriers of potential are formed by the silicon between the layers of germanium.

A third type of radiative centre can be formed from quantum boxes formed from a film of germanium or silicon-germanium, or from other elements introduced into the silicon.

In fact, due to the lattice mismatch parameter between the silicon and the germanium, the film of germanium, if its thickness exceeds a thickness of several single layers, naturally transforms into a succession of isolated islands spread out over the active region, which form the quantum boxes.

These islands are between 100 and 1000 times more efficient for the emission of light than germanium in the form of a solid layer. The introduction of such islands into the silicon film thus makes it possible to form a very efficient light emitter.

The photons in the active region can be created by optical or electric "pumping".

In the first case, the means for creating the photons in the active region can comprise an additional light source.

In the case of electric pumping, the means for creating the photons in the active region comprise a diode formed in the active region.

The device of the invention can comprise a single active zone in the form of, for example, as evoked above, a continuous layer of silicon.

According to a variant, however, the device can also comprise a plurality of active regions between the first and second insulator layers and separated from each other by an insulator material.

The active regions can, for example, be islands of silicon surrounded by silicon oxide. The islands have preferably a characteristic size of between 100 and 200 nm. In particular, it can be advantageous to have a characteristic size more or less equal to the thickness.

The role of the layers or zones of insulator that delimit or surround the active zones is essentially to limit the movement of the carriers which move predominantly under the effect of diffusion, or, depending on the case, under the effect of an electrical field.

The insulator layers or zones are preferably made out of a material with a wide forbidden band, in such a way as to put high potential barriers in the way of the carriers. Amongst these insulator materials, one can cite, for example, SiC (silicon carbide).

As is the case with many other insulators, the lattice mismatch between silicon carbide and silicon is too important to envisage building up silicon on the SiC with a good crystalline quality.

In order to overcome this difficulty, the invention also has as an aim a manufacturing process for a device as described previously. This process comprises the transfer, by molecular bonding, of a thin layer of silicon, which is intended to form the active region, onto a support that forms or comprises a first layer of insulator. The process is completed by covering the said layer of silicon by a second layer of insulator.

The transfer by molecular bonding makes it possible to combine the silicon with insulator materials that have excellent potential barrier properties, even if these materials do not have a crystalline structure or if these materials have a crystalline structure that is incompatible with the growth of silicon.

The thin layer of silicon can be transferred onto a solid insulator support made out of a material such as, for example, SiC, ZnO, AlN or BN alloys.

The techniques of molecular bonding, which are well known in themselves, are not described here.

According to another possibility, the thin layer of silicon can also be bonded onto a support formed from a silicon substrate covered by a superficial layer of dielectric material commonly used in the micro-electronics field, such as $SiO_2$, $Si_3N_4$ or quartz.

According to another particular embodiment of the process, the transfer of the thin layer comprises molecular bonding onto the support of a thick block of silicon by a transfer face, the block of silicon having a preferential cleavage zone that is parallel to the face of the transfer and which delimits the thin layer and then, after bonding, the cleavage of the said block to separate the thin layer from the block. The cleavage zone can be formed, for example, before the transfer by implanting the appropriate ions, such as hydrogen ions, at a defined depth in the block of silicon in order to create, in the block, the preferential cleavage zone.

According to a variant, the transfer of the thin layer can comprise the bonding onto the support of a thin layer of silicon connected to a substrate of the support (for example, in solid silicon) via a sacrificial layer, then the separation of the thin layer from the substrate by dissolution of the sacrificial layer.

As an example, the layer of silicon that is intended to form the active layer can be formed by epitaxy on the substrate of silicon that has been previously covered with a sacrificial layer of GeSi alloy.

The composition and thickness of the layer of GeSi are preferably chosen in such a way as to allow the growth of a layer of silicon with good crystalline quality.

The layer of silicon can also be partially oxidised in order to cover it with a layer of oxide.

The substrate with the layer of silicon is then Transferred onto the support, and the SiGe alloy is dissolved in order to detach the layer of silicon forming the active region from the substrate.

According to another possible embodiment of the device, the process can also comprise the formation of a layer of oxide buried in a block of silicon, in such a way as to delimit in it a thin superficial layer of silicon, the thin superficial layer being intended to form the active region, then covering the thin layer by a layer of oxide.

Other characteristics and advantages of the present invention will become clearer from the description that follows and by referring to the Figures in the Appendix. This description is only given as an illustration and does not limit the invention in any way.

DETAILED DESCRIPTION OF THE METHODS FOR APPLYING THE INVENTION

In the following description, the identical, similar or equivalent parts of the different figures are indicated with the same reference numbers. For reasons of convenience, the equivalent parts are not however always represented on the same scale in the different figures.

Figure 1:
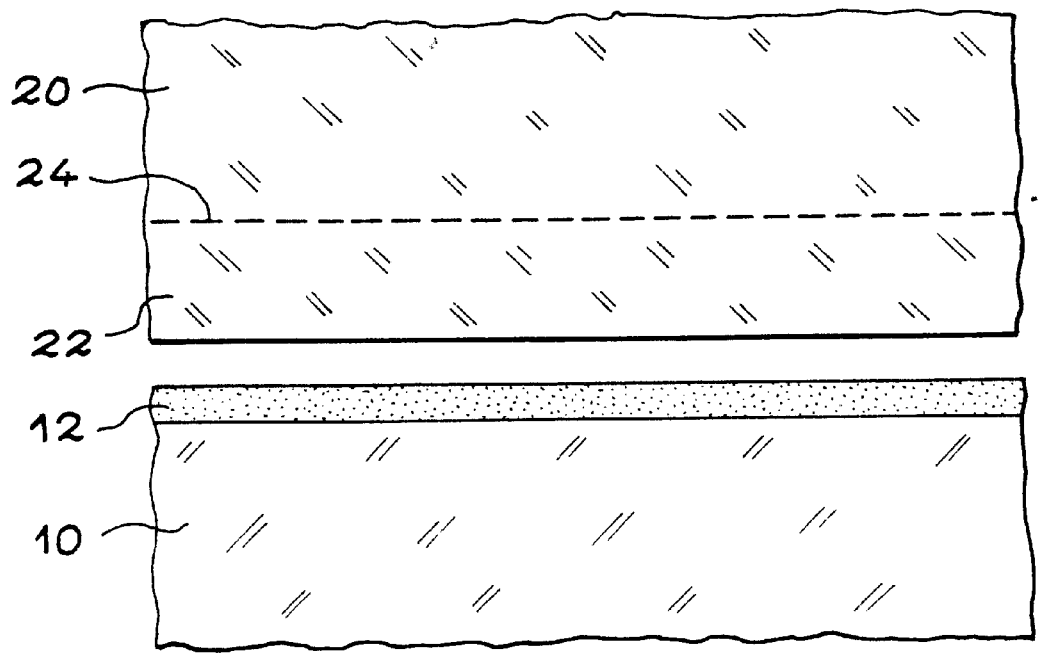
FIGS. 1 and 2 are partial schematic sections of an electro-optical device illustrating an aspect of the process for forming an active region between two insulator layers, in accordance with the invention.

Reference 10 in FIG. 1 designates a substrate of a support in silicon on which one wishes to form a device as described previously.

The support 10 has, on its surface, a first layer 12 of silicon oxide, used here as an insulator.

As a variant, the assembly formed by the support 10 and the first layer 12 can be replaced by a support or a thick, solid insulator layer, for example silicon carbide.

Reference 20 designates a second substrate of silicon, of a mono-crystalline type with a thin, superficial layer 22 separated from the rest of the substrate by a zone 24 of preferential cleavage.

The cleavage zone 24, as evoked previously, can be formed by the implantation of hydrogen ions at a given depth in the substrate.

The superficial layer 22 can contain impurities or other defects that form radiative recombination centres for the carriers. These characteristics are not shown in FIG. 1, but will be described in greater detail in the text that follows.

The second substrate 20 is transferred onto the support 10 by bonding the free surface of the superficial Layer onto the first layer of silicon oxide 12.

The bonding is carried out without adding binding material, but by molecular bonding between the parts placed in contact.

According to a variant, the first layer of oxide can also be formed initially on the thin, superficial layer of silicon of the second substrate.

In this case, the molecular bonding takes place between this layer and the support 10.

Figure 2:
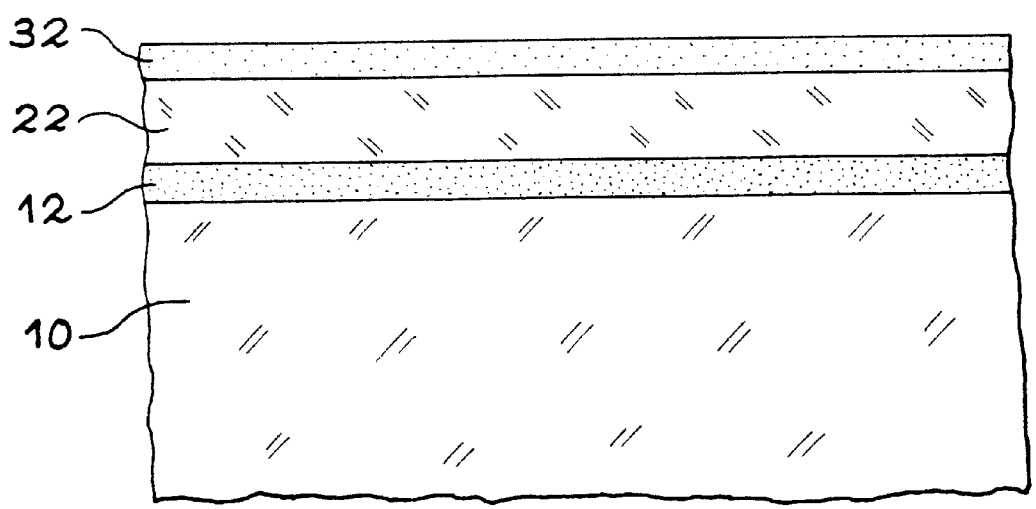

FIG. 2 shows the structure obtained after bonding the thin layer of silicon, the cleavage along the cleavage zone and the elimination of the remaining part from the second substrate.

According to a variant, the cleavage zone 24, which can be seen in FIG. 1, can be replaced by a sacrificial layer. The structure in FIG. 2 is then obtained by bonding and then selective dissolution of the superficial layer.

One can also see in FIG. 2 a second layer of silicon oxide 32, which covers the thin layer of silicon 22. The second oxide layer 32 can be formed, for example, by deposition or surface oxidation of the silicon layer.

It can be seen that, according to another manufacturing process, the first silicon oxide layer can also be formed by the implantation of oxygen ions into a block of silicon with sufficient energy to bury it under the superficial layer 22.

FIGS. 3A, 3B, 4 and 5 described below, correspond to the structure shown in FIG. 2, and show different types of radiative centres that could be formed in the layer of silicon 22 and different configurations of the layer of silicon. It should be understood that these different possibilities are not mutually exclusive.

Figure 3A:
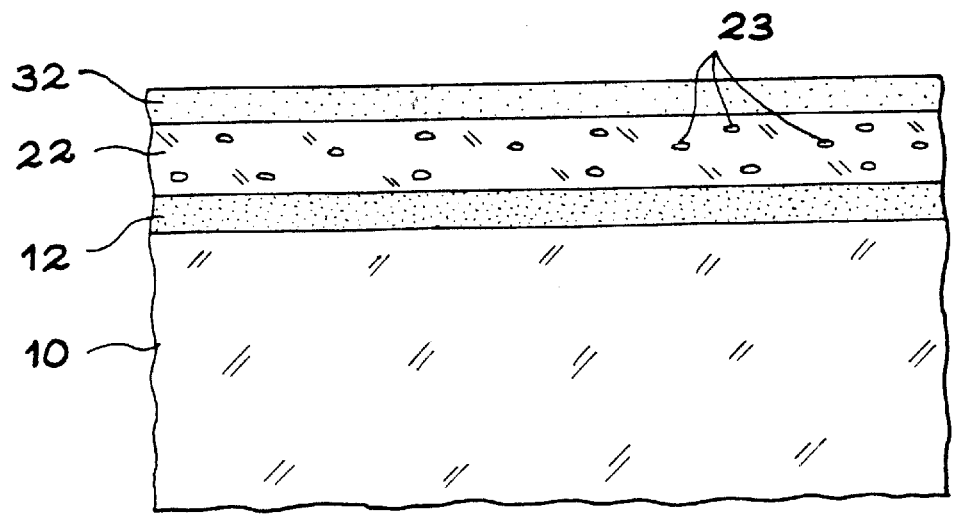
FIGS. 3A, 3B, 4 and 5 are partial schematic sections of devices in accordance with the invention and illustrate the different characteristics and possible embodiments of the active layer.

In the example given in FIG. 3A, the radiative centres are formed by the impurities 23, such as the ions of rare earth elements, spread out in the thin layer of silicon.

These impurities can be put in place by ionic implantation. They can be introduced at different stages of the manufacture of the structure, for example by implantation into the substrate 20 before molecular bonding or by implantation into the thin film 22 after bonding.

Figure 3B:
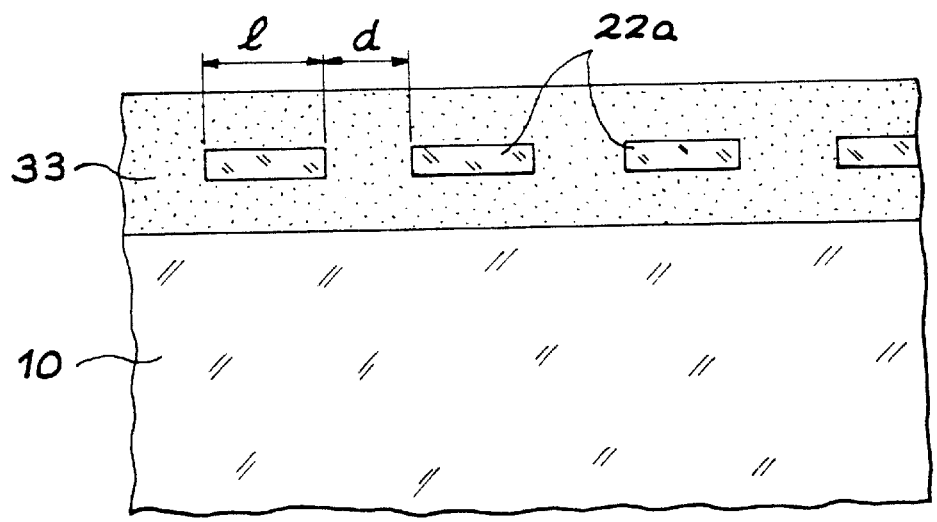

FIG. 3B shows a particular embodiment in which, by means of an oxidation that goes through the layer of silicon, a plurality of discontinuous islands 22a, each forming an active region, has been formed. Each of these active regions can contain impurities or other radiative centres, in the same way as the layer 22 of silicon in FIG. 3. The radiative centres of the device, in FIG. 4, are not represented for reasons of clarity.

In FIG. 3B, "1" designates the length of the islands parallel to the surface of the support 10 and "d" designates the distance between the islands. This length "1" is preferably of the same order as the thickness of the islands. This length is between 100 nm and 200 nm, for example, the same as the thickness of the islands.

Figure 4:
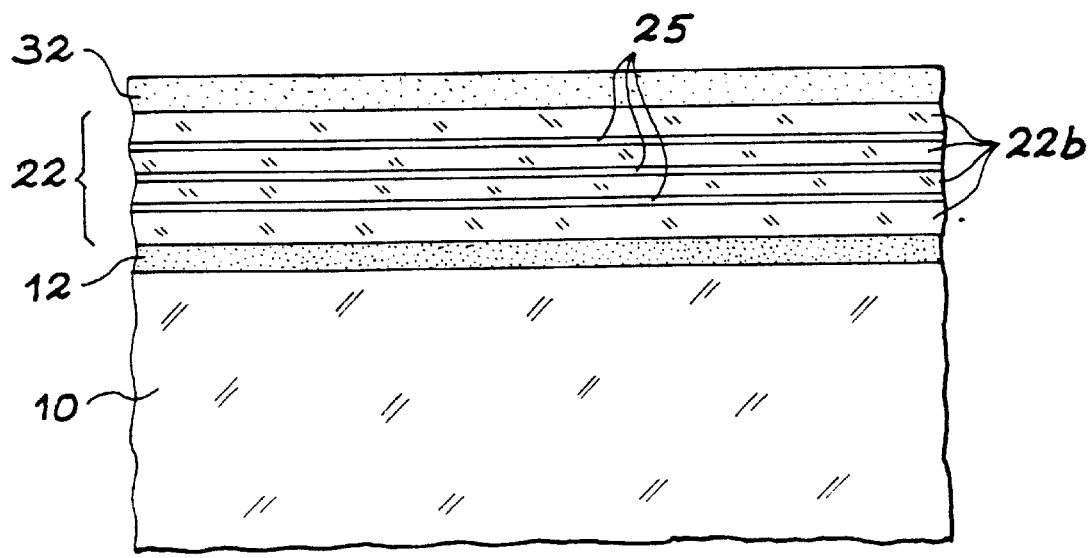

FIG. 4 shows a variant in which the radiative centres are formed by quantum wells.

The quantum wells are formed by thin layers 25 of germanium or $Si_{1-x}Ge_x$ alloy ($0 < x \leq 1$) or SiGeC or any other material suitable for the formation of quantum wells, inserted in the layer of silicon. The layers 25 form quantum wells and have a sufficiently low thickness, for example around 5 nm, so that the total thickness of these layers does not provoke dislocations in the silicon, resulting from a lattice mismatch. As an example, the structure can comprise five layers of quantum wells in $Si_{1-x}Ge_x$ with x=0, 2.

The layers 25 of quantum wells are separated by thin barriers formed by sub-layers 22b of the silicon layer 22.

The layer of silicon, which forms the active region, can be formed through epitaxy by successively alternating the sub-layers 22a of silicon and the sub-layers forming the quantum wells 25.

Figure 5:
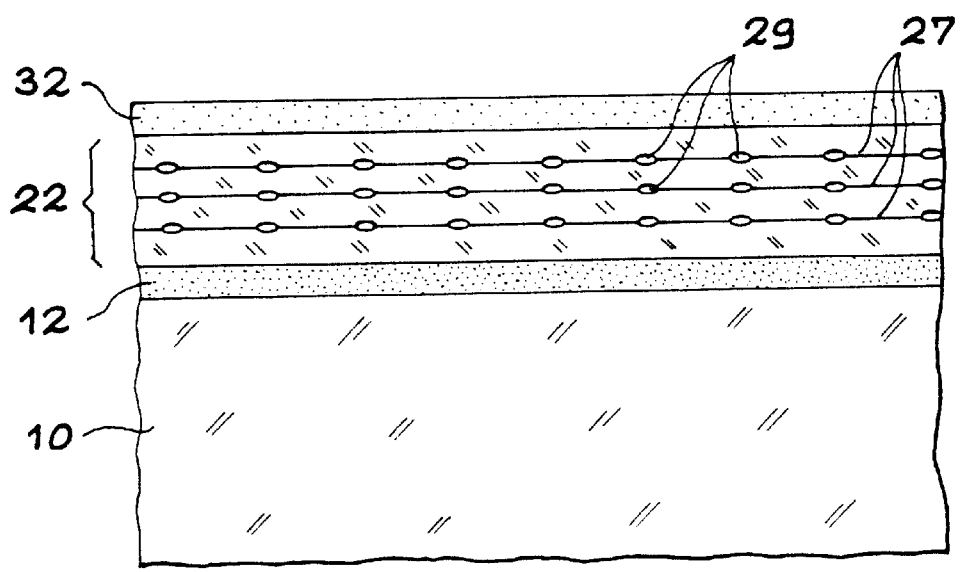

FIG. 5 shows another possibility in which the radiative centres are quantum boxes 29.

The quantum boxes 29 are obtained by introducing, into the layer of silicon 22, layers of germanium 27 whose thickness is of the order of several mono-atomic layers. These layers are too thin to introduce dislocations into the silicon.

Nevertheless, due to a lattice mismatch between the silicon and the germanium, islands of germanium 29 are naturally formed, which form quantum boxes.

Figure 6:
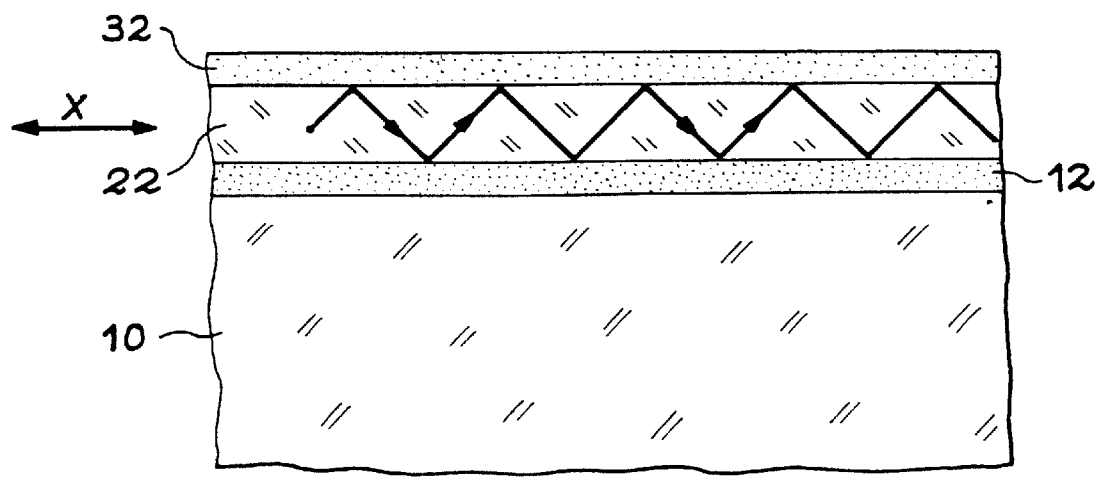
FIGS. 6 and 7 are partial schematic sections of the devices in accordance with the invention and illustrate the different possibilities for embodying the means for guiding the light.

FIG. 6 shows a first possibility for embodying the means for confining the carriers and guiding the light, which profitably employs a step index between the layer of silicon 22 and the first and second layers of silicon oxide 12 and 32.

In this embodiment, the optical thickness e of the active region, in other Words the layer 22, is adapted in such a way as to fit the formula e=k/2. λ, where λ is the working wavelength of the device and k a whole integer.

The propagation of the light takes place by total reflection on the layers of silicon oxide, in such a way that the guiding of the light takes place along a principal plane of the active region, parallel to the first and second layers of oxide, and indicated with a double arrow X.

Figure 7:
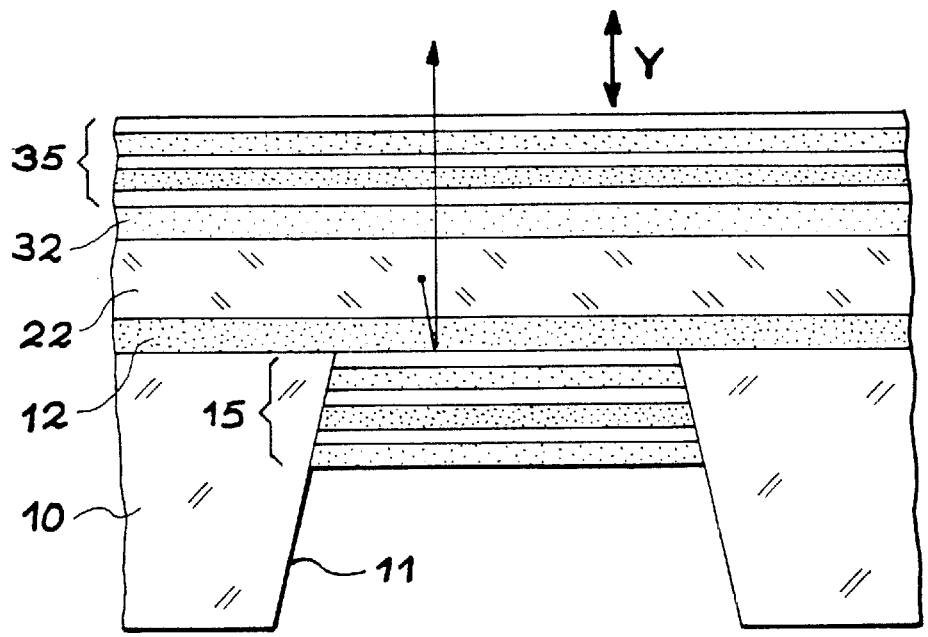

FIG. 7 shows a second possibility for embodying the means for guiding the light.

The means for guiding comprise a first mirror 15 formed on a free face of the first oxide layer 12, and located in an opening 11 made by engraving in the first substrate 10.

A second mirror 35 for the means of guiding is formed on the free surface of the second oxide layer 32.

The free faces of the oxide layers are taken to mean the faces that are not in contact with the active region.

The mirrors 15 and 35 are formed, for example, by alternating layers of dielectric material in the manner of a Bragg mirror. The pairs of layers are, for example, ZnS/YF$_3$ or SiO$_2$/Si$_3$N$_4$.

Preferably, the layer of silicon 22 and the first and second layers of silicon oxide 12, 32 are chosen in such a way as to form a Fabry-Pérot type cavity.

With the device in FIG. 7, the propagation of the light is more or less perpendicular to the principal plane of the active region, in other words, perpendicular to the mirrors.

The direction of propagation is indicated by a double arrow Y.

Figure 8:
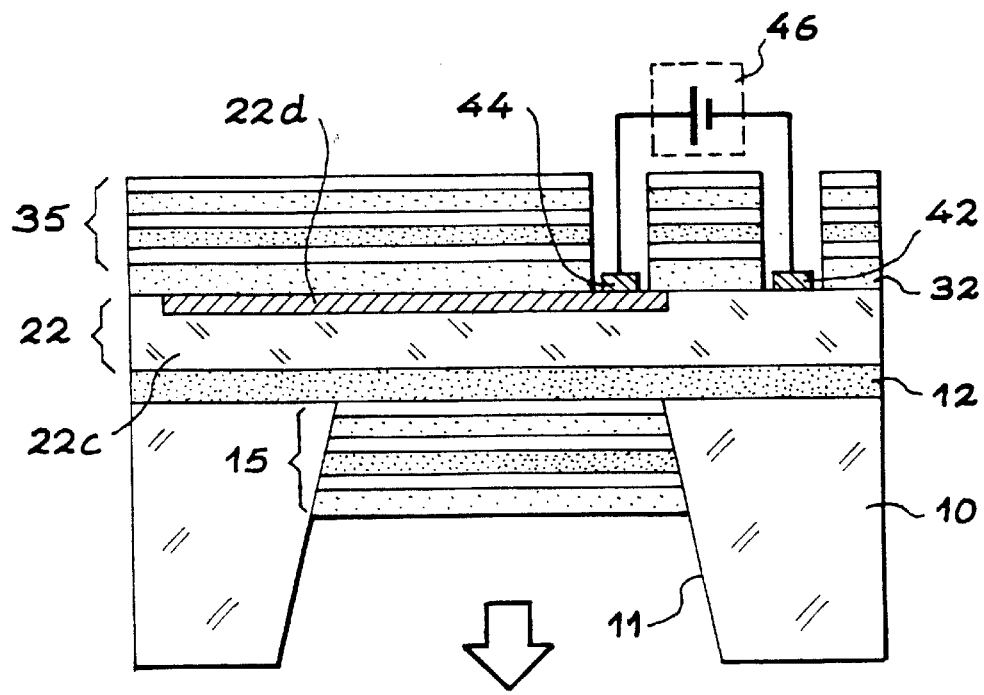
FIGS. 8 and 9 are partial schematic sections of the devices in accordance with the invention and illustrate the different possibilities for embodying the means of pumping.
Figure 9:
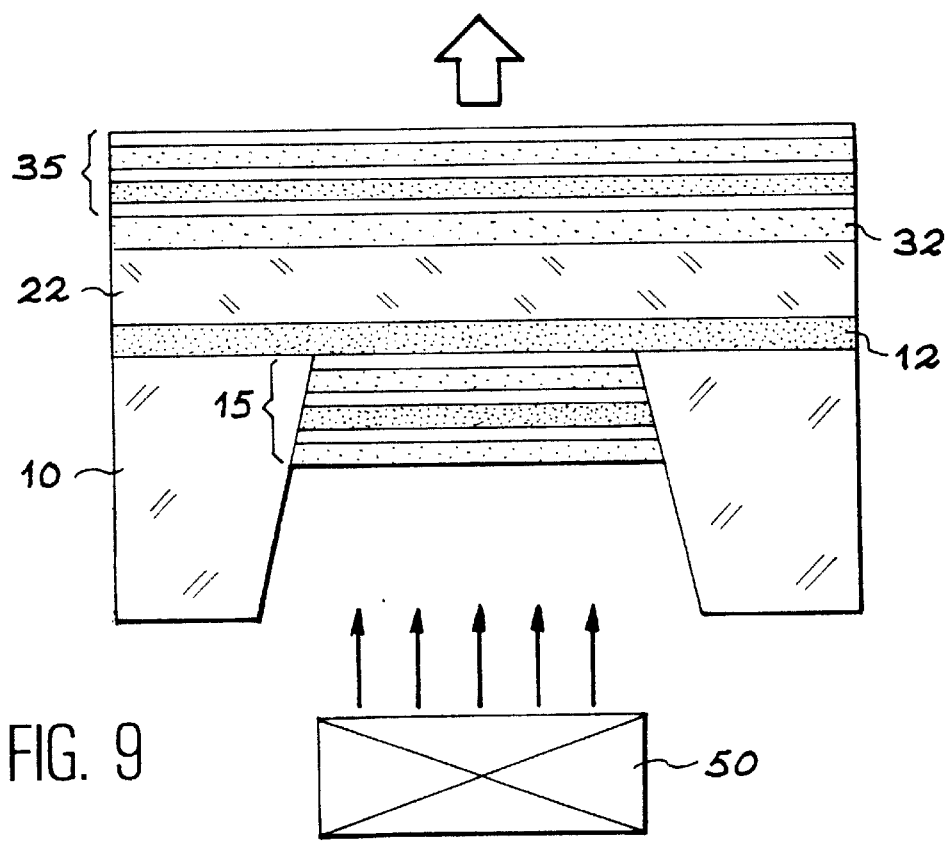

FIGS. 8 and 9 show particular embodiments for the means for pumping used in the devices whose structure is more or less that illustrated in FIG. 7. It should however be noted that the means for pumping can be adapted to the other possible forms of the device, and which were described previously.

In device shown in FIG. 8, the layer 22 of silicon, forming the active region, comprises a first Dirt 22c with a first type of conductivity, and a second part 22d, with an opposite conductivity to that of the first part, in such a manner as to create, in the active region, a diode junction. The second part 22d can be formed by the implantation of ions into the first part 22c of the silicon layer.

The contacts 42, 44 formed respectively on the first and second parts 22c, 22d of the silicon layer, are connected to a voltage source 46, in order to polarise the junction and provoke the passage of a current accompanying the radiative recombination of electrons and holes.

The contacts 42 and 44 are formed in the openings made in the second mirror 35.

The second mirror 35 has, in this example of an embodiment, a coefficient of light transmission less than 1%, while the first mirror 15 has a coefficient of transmission that enables light to be extracted, of around 40%.

Thus, the light is extracted through the first mirror 15 and through the opening 11 of the support 10. An arrow indicates the light extraction.

FIG. 9 shows a device in which the role of the mirrors is reversed.

The first mirror 15 has a very low coefficient of transmission of light at the working wavelength, while the second mirror 35 allows (in part) the light coming from the active region to exit.

Unlike the device in FIG. 8, the device in FIG. 9 is optically pumped from a source of pump light 50.

The source of pump light can be a laser, pulsed or not, which must be absorbed in an efficient manner in the active layer 22. With this in mind, a short wavelength laser is preferred. The wavelength of the pump light is chosen different to that of the working wavelength of the light from the active region.

The first mirror 15 receiving the pump light is tuned to be transparent to the wavelength of this light, and resonating to the working wavelength of the device.

DOCUMENTS CITED (1)
EP-A-0 517 440

(2)
GB-A-2 275 582

(3)
"Giant enhancement of luminescence intensity in Er-doped Si/SiO$_2$ resonant cavities" Appl. Phys. Lett. 61 (12), Sept. 21, 1992 By E. F. Schubert et al.

(4)
"Silicon intersubband lasers" Superlattices and Microstructures, vol. 23, n° 2, 1998 By Richard A. Soref.

(5)
"Prospects for novel Si-based optoelectronic devices: unipolar and p-i-p-i lasers" Thin solid films, 294 (1997), 325–329 By Richard A. Soref (6)
"Characterisation of bond and etch-back silicon-on-insulator wafers by photoluminescence under ultraviolet excitation" Appl. Phys. Lett. 70 (2), Jan. 13, 1977 By M. Tajima et al.

(7)
"Luminescence due to electron-hole condensation in silicon-on-insulator" Journal of Applied Physics, volume 84, n° 4, Aug. 15, 1998 By Michic Tajima et al.

(8)
WO 96 25767-A-

(9)
REITTINGER A. et al.: "INFLUENCE OF THE ERBIUM AND OXYGEN CONTENT ON THE ELECTROLUMINESCENCE OF EPITAXIALLY GROWN ERBIUM-DOPED SILICON DIODES" APPLIED PHYSICS LETTERS, Vol. 70, n° 18, May 5, 1997 (May 5, 1997), pages 2431–2433.

What is claimed is:

1. Light emitting and guiding device comprising at least one active region (22) in silicon and the means for creating photons in the said active region, whereby the means for creating the photons comprises a diode (22c, 22d) formed in the active region, whereby the device comprises the means for confining, with a first and a second insulator layers (12, 32), to confine the carriers injected by the diode, and whereby the silicon in the active region is mono-crystalline.

2. Device according to claim 1, for the propagation of light with a given wavelength λ, in which the assembly comprising the active region and the layers of insulator has an optical thickness e, such that:

$$e = k\frac{\lambda}{2}$$

where k is a natural number.

3. Device according to claim 1, in which the first and second layers of insulator are layers of silicon oxide.

4. Device according to claim 1, comprising in addition to the means of reflecting light, comprising at least one mirror (15, 35) arranged on a free face of at least one of the first and second layers of insulator.

5. Device according to claim 4, in which the means for reflecting the light comprise a first mirror (15) arranged on the free face of the first insulator layer (12) and a second mirror (35) arranged on the free face of the second insulator layer (32), the first and second mirrors having different coefficients of transmission.

6. Device according to claim 5, in which the first and second mirrors form, with the active region and the insulator layers, a Fabry-Pérot type cavity.

7. Device according to claim 4, in which at least one mirror (15, 35) comprises a stack of dielectric layers.

8. Device according to claim 1, in which the means for creating photons in the active region comprise, moreover, an additional source of light (50).

9. Device according to claim 1, in which the active region comprises radiative centres.

10. Device according to claim 9, in which the radiative centres are in a material chosen from Si, Ge, SiGe and SiGeC.

11. Device according to claim 9, in which the radiative centres comprise rare earth element impurities (23) in the active region.

12. Device according to claim 9, in which the radiative centres comprise at least one quantum well in the active region.

13. Device according to claim 9, in which the radiative centres comprise quantum boxes (29) spread out over the active region.

14. Device according to claim 1, comprising a plurality of active regions (22a) between the first and second insulator layers and separated from each other by an insulator material.

15. Device according to claim 14, in which the active regions (22a) are islands surrounded by insulator material, the islands having a characteristic size (1) more or less equal to their thickness.

16. Manufacturing process for a device according to claim 1, whereby it comprises the transfer of a thin layer of silicon that is intended to form the active region onto a support by molecular bonding, then covering the said layer of silicon by an insulator layer.

17. Process according to claim 16, in which the transfer of the thin layer comprises:

the molecular bonding on the support of a block of thick silicon (20) by a transfer face, the block being provided with a preferential cleavage zone (24) parallel to the transfer face and which delimits the thin layer (22)

then, after the bonding, the said block is cleaved to separate the thin layer from it.

18. Process according to claim 16, in which the transfer of the thin layer comprises the bonding, onto the support, of a layer of silicon connected to a silicon substrate via a sacrificial layer, then the separation of the thin layer from the substrate by dissolution of the sacrificial layer.

19. Manufacturing process for a device according to claim 3, comprising the formation of a first layer of oxide (12) buried in a block of silicon in such a way as to delimit a thin superficial layer of silicon (22) in the block, the thin superficial layer being intended to form the active region, and then covering the thin layer by a second layer of oxide.

* * * * *

UNITED STATES PATENT AND TRADEMARK OFFICE
CERTIFICATE OF CORRECTION

PATENT NO. : 6,570,187 B1  Page 1 of 1
DATED : May 27, 2003
INVENTOR(S) : Jean-Louis Pautrat et al.

It is certified that error appears in the above-identified patent and that said Letters Patent is hereby corrected as shown below:

Column 2,
Line 12, please delete the second occurrence of "an", and insert therefor -- on --.

Column 5,
Line 26, please delete "Transferred", and insert therefor -- transferred --.

Column 7,
Line 40, please delete "Words", and insert therefor -- words --.

Column 8,
Line 9, please delete "Dirt", and insert therefor -- part --.

Column 10,
Line 21, please delete "(1)", and insert therefor -- ($l$) --.

Signed and Sealed this

Sixteenth Day of December, 2003

JAMES E. ROGAN
*Director of the United States Patent and Trademark Office*